United States Patent [19]

Kleyer

[11] Patent Number: 5,179,622
[45] Date of Patent: Jan. 12, 1993

[54] SERIES EVAPORATOR FOR VACUUM VAPOR-DEPOSITION APPARATUS

[75] Inventor: Siegfried Kleyer, Hainburg, Fed. Rep. of Germany

[73] Assignee: Leybold Aktiengesellschaft, Hanau, Fed. Rep. of Germany

[21] Appl. No.: 574,595

[22] Filed: Aug. 29, 1991

[30] Foreign Application Priority Data

May 19, 1990 [DE] Fed. Rep. of Germany ....... 4016225

[51] Int. Cl.$^5$ .............................................. C23C 14/26
[52] U.S. Cl. .................................... 392/389; 118/726
[58] Field of Search ................. 392/389, 388, 403; 118/726, 727

[56] References Cited

U.S. PATENT DOCUMENTS

| | | | |
|---|---|---|---|
| 2,554,902 | 5/1951 | Godley | 118/726 |
| 2,969,448 | 1/1961 | Alexander | 392/389 |
| 3,117,887 | 1/1964 | Shepard | 392/389 |
| 3,281,517 | 10/1966 | Hemmer | 392/289 |
| 3,544,763 | 12/1970 | Geir | 392/289 |
| 3,554,512 | 1/1971 | Elliott | 118/726 |
| 3,563,202 | 2/1971 | Mackrael | 392/289 |
| 3,617,348 | 11/1971 | Kelley | 118/726 |
| 3,637,980 | 1/1972 | Fox | 392/289 |
| 4,264,803 | 4/1981 | Shinko | 392/289 |
| 4,537,506 | 8/1985 | Lersmacher | 392/389 |
| 4,632,059 | 12/1986 | Flatscher | 392/289 |

FOREIGN PATENT DOCUMENTS 55-2709 1/1980 Japan ..................................... 118/726

*Primary Examiner*—Teresa J. Walberg
*Attorney, Agent, or Firm*—Felfe & Lynch

[57] ABSTRACT

A series evaporator for vacuum vapor-deposition apparatus has several evaporators 5 with individual power control, heated by passing through a current, supported on column-like, electrical supply lines 3, 4 wherein the column-like supply lines 3, 4 are held by an electrically conductive support body 6 extending over the entire length of the series evaporator, and the supply lines 3 of the one polarity are connected to the support body 6 in an electrically conductive manner whereas the supply lines 4 of the other polarity pass through the support body 6 in an insulated manner and connected to conducting wires 7 disposed in an insulated manner.

8 Claims, 1 Drawing Sheet

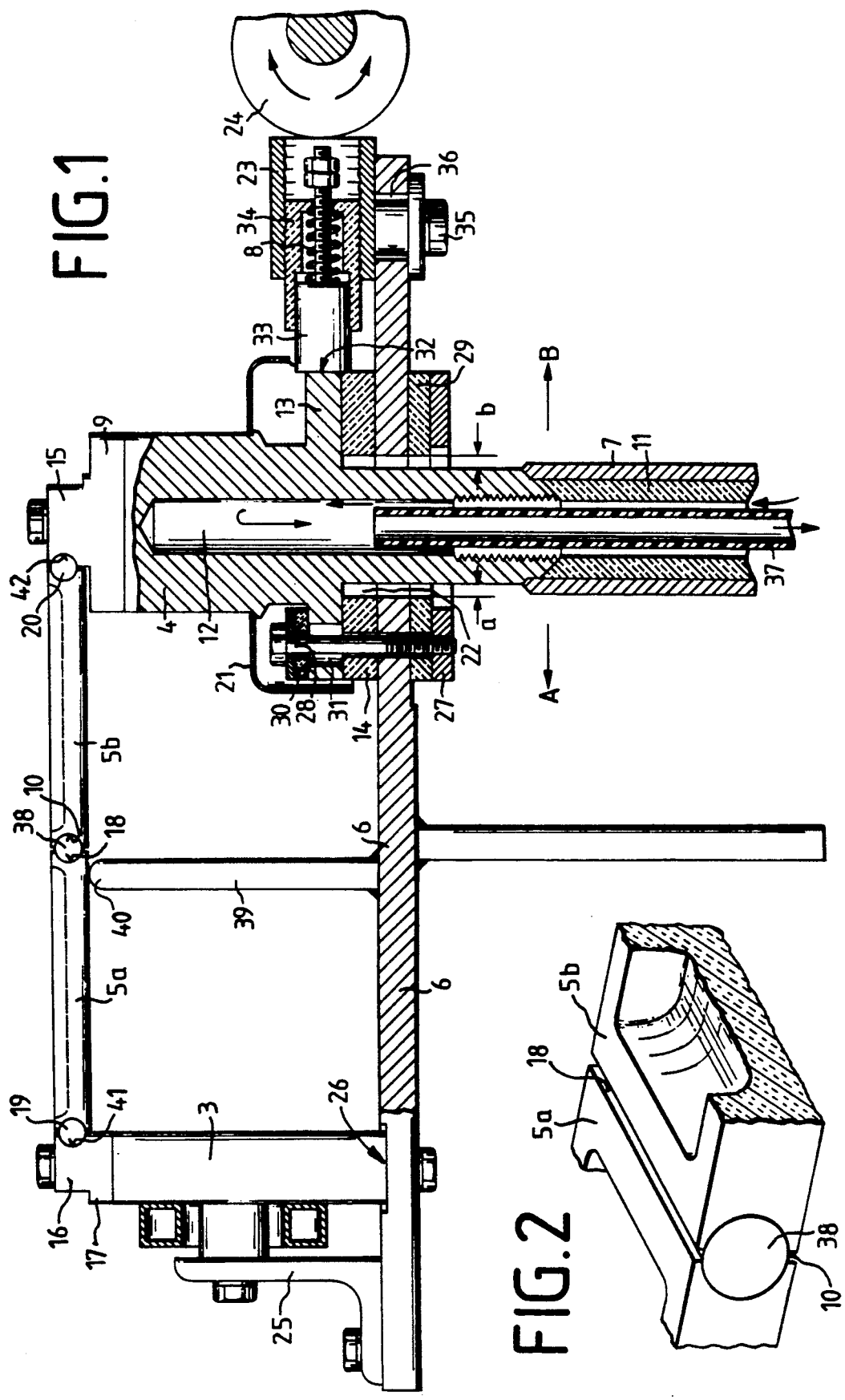

SERIES EVAPORATOR FOR VACUUM VAPOR-DEPOSITION APPARATUS

BACKGROUND OF THE INVENTION

The invention relates to a series evaporator for vacuum vapor-deposition apparatus, in particular vapor-deposition apparatus for belts, comprising several evaporators with individual power control, heated by a current that passes through and mounted on column-like electrical supply lines. These column-like supply lines are held by an electrically conductive support body which extends over the entire length of the series evaporator. Further, the supply lines of the one polarity are connected to the support body in an electrically conductive manner whereas the supply lines of the other polarity are insulated and pass through the support body and connected to conducting wires which are disposed in an insulated manner.

A series evaporator is known (U.S. Pat. No. 3,387,116) where the trough-like evaporation vessel is clamped in between a first stationary, column-like supply line and a thrust piece which is under spring tension and held and guided at a second stationary supply line.

SUMMARY OF THE INVENTION

The object underlying the present invention is to provide a series evaporator where a plurality of individual evaporators is clamped in pairs between the electrical supply lines. At the same time, it must be ensured that the current passing through during the evaporation process is not interrupted.

The object is accomplished in accordance with the invention in that the evaporator, with bearing elements preferably configured as cylindrical segments, is supported on the top ends or projections of the supply lines. These bearing elements are made of a current-conducting material, for example, a ceramic material.

BRIEF DESCRIPTION OF THE DRAWINGS

FIG. 1 is a side view and a partly sectional view of a device for holding a pair of evaporators of a vacuum vapor-deposition apparatus and FIG. 2 is a perspective representation of the connection of the two evaporators disposed in tandem.

DETAILED DESCRIPTION OF THE PREFERRED EMBODIMENT

The series evaporator essentially comprises a support body 6 configured as a T-shaped element. The top of this body 6, by means of threaded connections, is attached to a plurality of parallel disposed, L-like support bodies 25. Column-like supply lines 3 are connected to each of these support bodies 25 and the bottom ends of these lines, also at 26, are firmly attached to the support body 6 in threaded connections.

Each of the supply lines 3, via a threaded connection, is connected to a top portion 17. The projection 16 thereof, via bearing element 19, rests against one trough-like evaporator 5a extending in a plane that is parallel with respect to the support body 6. The one end of each evaporator 5a facing away from the supply line 3 rests against the front surface of a second evaporator 5b. This second evaporator 5b rests at the projection 15 of the top portion 9 of a column-like supply line 4 which, as compared to the opposite supply line 3, is supported on the support body 6 where it can be moved in a horizontal plane.

In order to allow this movement in direction A and B, indicated by arrows, the supply line is provided with a collar 13 which permits the supply line 4 to rest on an annular insulating piece 14. The lower portion of the supply line 4 extends with play a, b across an opening 22.

A screw 28 joins a bottom guide plate 17 to the collar piece 13 to prevent the supply line 4 from slipping out of the opening 22. Insulating pieces 29, 30 are disposed between the head of screw 28 and the collar piece 13 as well as between the guide plate 27 and the support body 6.

Since the screws 28 also pass through a bore 31 in the collar piece 13, this bore being much larger than the diameter of the shaft of screw 28, there is no electrically conductive connection between supply line 4 and support body 6.

A thrust piece 33 rests against one side 32 of the collar piece 13 and is under the tension of the pressure spring 8. The latter is disposed and supported in an insulating sleeve 34 which in turn is part of guide 23 connected to the support body 6 by means of a screw 35.

Since the screw 35 traverses the bore 36 with play, it is possible to move the guide 23 on the support body to a limited extent. The guide 23 rests on a stationary but rotatably disposed camshaft, i.e. on a gear 24 thereof, so that the force by which spring 8 acts on supply line 4 in direction A can be adjusted.

Supply line 4 is connected to the tubular conducting wire 7 in an electrically conducting manner. This conducting wire 7 surrounds a tube 11 through which coolant is pumped into channel 12. This coolant, after passing through chamber 12, can then be discharged via a tube or flexible pipe 37.

Between the projections 16, 15 of the two column-like supply lines 3, 4 and the evaporators 5a, 5b supported or clamped therebetween, there are graphite bearings 19, 20 which serve the purpose of providing a largely loss-free transition of current between the supply lines 3, 4 and the evaporator 5a, 5b.

If the camshaft or the cam gear 24 is now rotated with respect to the position represented, then the tension force of spring 8 acting on the evaporator 5a, 5b is reduced allowing supply line 4 a small escape movement in direction B. The evaporators 5a, 5b can then be replaced by another pair of the same total length without further problems.

Further, a shield-like bellows 21 is provided at the collar piece 13 of the column-like supply line 4. It ensures that no evaporation residues or other contaminating material enter the bores 22 and 31 impairing the free movement of supply line 4.

A trestle 39 is firmly attached to the support body 6. The comb-like, top end of this trestle supports the evaporator 5a so that it is held in a horizontal position, on the one hand, but can change its length without interference on part of the trestle 39, on the other hand.

As seen in FIG. 2, a socket connection is provided to join the two evaporators 5a, 5b (a pair of evaporators, that is). It consists of a cylindrical and/or roller-like bearing element 38 which is supported on the correspondingly configured, semi-cup like front surfaces 10, 18 of the evaporators 5a, 5b or rests on these semi-cup like surfaces. It is understood that the projections 15, 16 are provided with correspondingly shaped semi-cup like support surfaces 41, 42 in which rest the roller-like bearing elements 19, 20. In order to ensure a best possible current flow across the evaporators 5a, 5b, the rollers and the bearing elements 19, 20, 38 are advantageously made of the same material as the evaporators 5a, 5b.

I claim:

1. Series evaporator for vacuum deposition apparatus, comprising
    an electrically conductive support body,
    a column-like electrical supply line of one polarity connected to said support body and having a projection remote from said body,
    a column-like electrical supply line of another polarity passing through said support body and electrically insulated therefrom and having a projection remote from said body,
    a plurality of electrically conductive evaporators connected in series between the projections on said-column like electrical supply lines, and
    a plurality of electrically conductive bearing elements which serve to electrically connect said evaporators to each other and to said projections, thereby completing the circuit between said projections via said evaporators.

2. Series evaporator as in claim 1 wherein said evaporators are made of ceramic.

3. Series evaporator as in claim 1 wherein said bearing elements are made of ceramic.

4. Series evaporator as in claim 1 wherein said bearing elements are cylindrical.

5. Series evaporator as in claim 4 wherein said evaporators are trough-like and essentially parallelpiped and define a longitudinal axis extending between said projections, said bearing elements having rotating axes which extend horizontally and transversely to said longitudinal axis.

6. Series evaporator as in claim 5 wherein each said projection has a cylindrical groove and each evaporator facing a projection has a cylindrical groove which cooperates with the cylindrical groove of said projection to receive a cylindrical bearing element therebetween.

7. Series evaporator as in claim 5 wherein each evaporator has a cylindrical groove which faces the groove of the facing evaporator to receive a cylindrical bearing element therebetween.

8. Series evaporator as in claim 5 further comprising a trestle upstanding from said support between said column-like electrical supply lines and having a comb-like support surface in contact with one of said evaporators.

* * * * *